United States Patent [19]

Toyama

[11] Patent Number: 4,864,305
[45] Date of Patent: Sep. 5, 1989

[54] D/A CONVERTER

[75] Inventor: Akira Toyama, Tokyo, Japan

[73] Assignee: Seikosha Co., Ltd., Tokyo, Japan

[21] Appl. No.: 167,346

[22] Filed: Mar. 14, 1988

[30] Foreign Application Priority Data

Mar. 13, 1987 [JP] Japan .................................. 62-58361

[51] Int. Cl.$^4$ ............................................ H03M 1/00
[52] U.S. Cl. .................................... 341/144; 341/122;
341/141; 341/152
[58] Field of Search ........................ 341/122, 144, 152

[56] References Cited

U.S. PATENT DOCUMENTS 4,467,319 8/1984 Uchikoshi .................... 340/347 DA
4,542,371 9/1985 Uchikoshi .................... 340/347 DA
4,686,509 8/1987 Araki et al. .................. 340/347 DA

FOREIGN PATENT DOCUMENTS 0095724 6/1984 Japan .................................. 341/144

Primary Examiner—William M. Shoop, Jr.
Assistant Examiner—Helen Kim
Attorney, Agent, or Firm—Bruce L. Adams; Van C. Wilks

[57] ABSTRACT

A digital-to-analog converting device, particularly useful in audio device such as compact disc players, including an adder (CA; CA1, CA2) for adding a common random data to a digital data (d) supplied at a constant period and to a sign-reversed data ($\bar{d}$), respectively. The signals containing the added random data are converted into analog form by a digital-to-analog converter (DT; DT1, DT2). The difference is taken between the analog signals obtained from the digital data (d) containing the added random data and the sign-reversed data ($\bar{d}$) containing the added random data. Such circuit arrangement can provide an analog ouput signal having an amplitude which is twice as large as that obtained by the prior art and yet the resistance thermal noise contained in such analog signal has a reduced relative magnitude, whereby an improvement in signal-to-noise ratio and in tone quality can be achieved.

14 Claims, 6 Drawing Sheets

FIG. 7
PRIOR ART
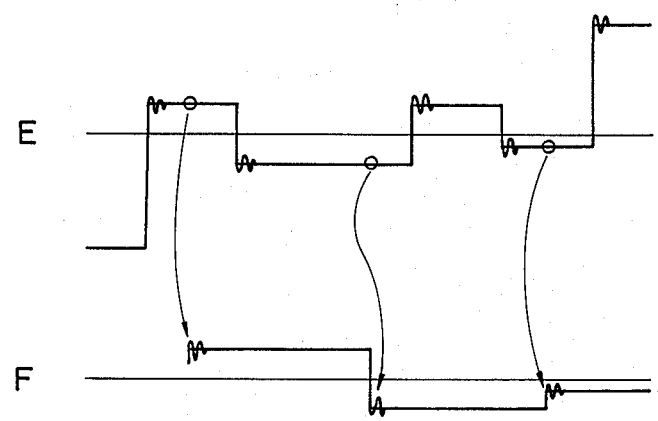
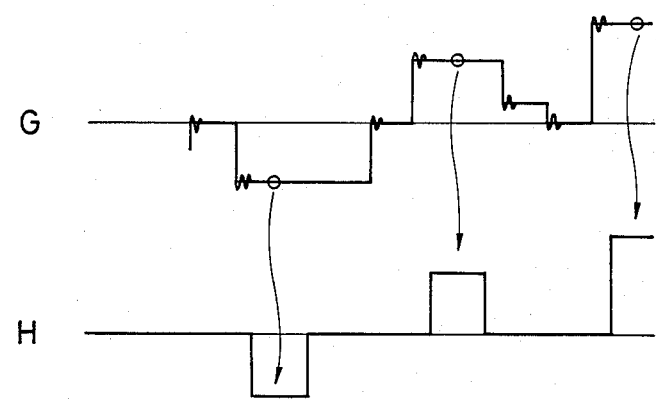

D/A CONVERTER

BACKGROUND OF THE INVENTION

1. Field of the Invention

The present invention relates to a digital-to-analog (D/A) converter.

2. Description of the Prior Art

In recent years, there has been a sudden increase in the demand for compact disc players, accompanied by the earnest desire for improvement in the tone quality. It is the conversion characteristics of the D/A converter as used in such apparatus that largely affects the tone quality, and thus various improvements in it have been proposed. One of the improvements is that which utilizes dithers.

The improvement aims at averaging the converting steps by means of dithers. That is, in accordance with such proposed improvement, random data corresponding to dithers is added to digital data when the latter is converted into an analog form, and the random data is subtracted after the D/A conversion. FIG. 5 shows a typical circuit embodying such an improvement, in which digital data, which is shown in FIG. 6A and is obtained by sampling at a frequency $f_s$, is added by an adder CA to random data (shown in FIG. 6B) of a frequency $f_s$ from a random data generating circuit RD. A selector alternately S selects the outputs from the adder CA and from the random data generating circuit alternately as shown in FIG. 6D, and a D/A converter DT, which receives the output from the selector S, generates an analog signal which corresponds to the input data, as shown in FIG. 7E, the analog signal portions of which correspond to the random data being sampled by a sample and hold circuit SH (as shown in FIG. 7F). A subtractor RE generates an output which corresponds to the difference between such sampled analog signal portions and the analog signal from the D/A converter DT. Specifically, the analog signal portions corresponding to the random data are subtracted from the output from the D/A converter DT, whereby an analog signal corresponding to the digital data is generated as shown in FIG. 7G. A deglitcher DG extracts stable portions of this analog signal as shown in FIG. 7H, excluding unstable portions at transition points of the analog signal. The thus obtained signal is passed through suitable circuit means such as a low-pass filter (not shown), whereby it is reproduced as an acoustic signal.

In the above-described prior art circuit, the output analog signal from the subtractor RE contains a resistance thermal noise power component which is twice as large as that which is contained in the input to the subtractor RE, the circuit arrangement therefore has a relatively poor signal-to-noise ratio.

Specifically, the subtraction will double, in terms of electric power, the resistance thermal noise component contained in the output from the subtractor RE, since the resistance thermal noise contained in the output from the D/A converter DT and the resistance thermal noise contained in the output from the sample hold circuit SH are not correlated together. This will deteriorate the signal-to-noise ratio, thereby degrading the tone quality.

An object of the present invention is therefore to improve the above-mentioned shortcomings in order to enhance the signal-to-noise ratio.

SUMMARY OF THE INVENTION

According to the present invention, an identical random data is added both to first digital data(d) supplied at a constant period, and to second digital data d̄ obtained by reversing the sign of said first digital data. The thus obtained data having the random data added thereto are converted to an analog signal by a D/A converter. The difference is taken between the analog signal portion obtained from said digital data d having the random data added thereto and the other analog signal portion obtained from said sign-reversed data d̄ having the random data added thereto.

BRIEF DESCRIPTION OF THE DRAWINGS

The present invention will now be described, by way of example, with reference to the accompanying drawings, in which:

BRIEF DESCRIPTION OF THE DRAWINGS

Figure 1:
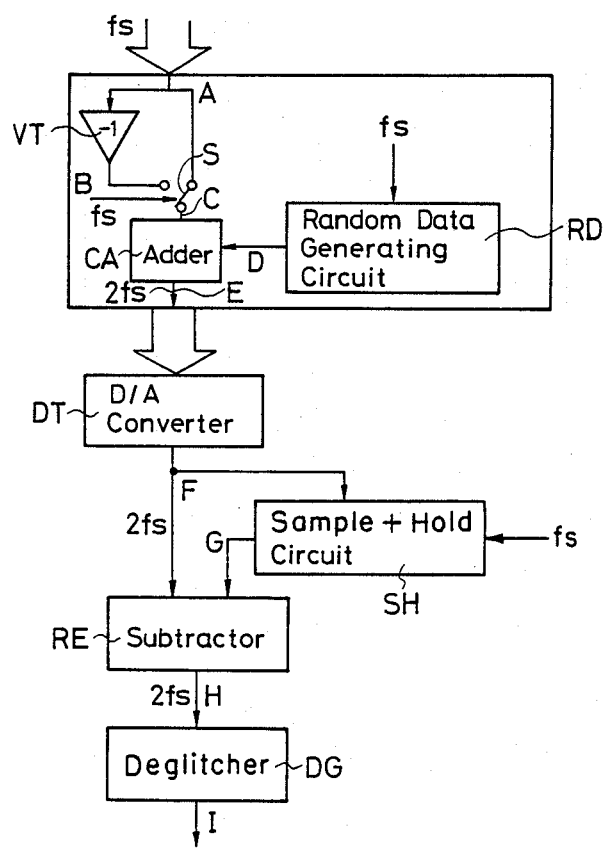
Figure 2:
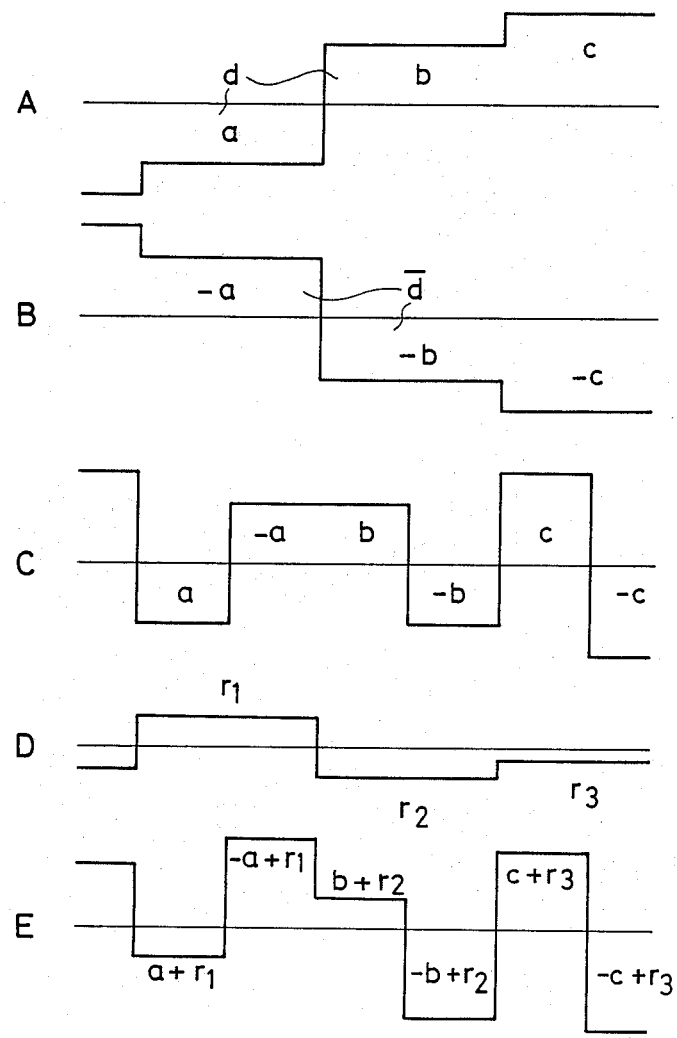
Figure 3:
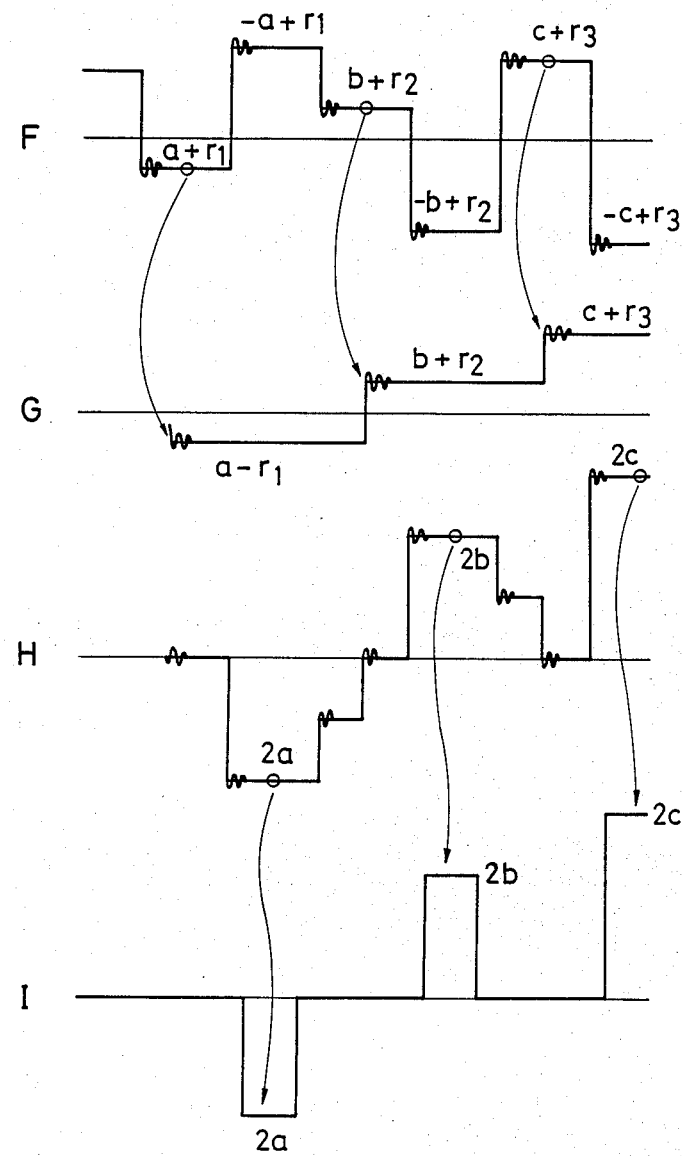
Figure 4:
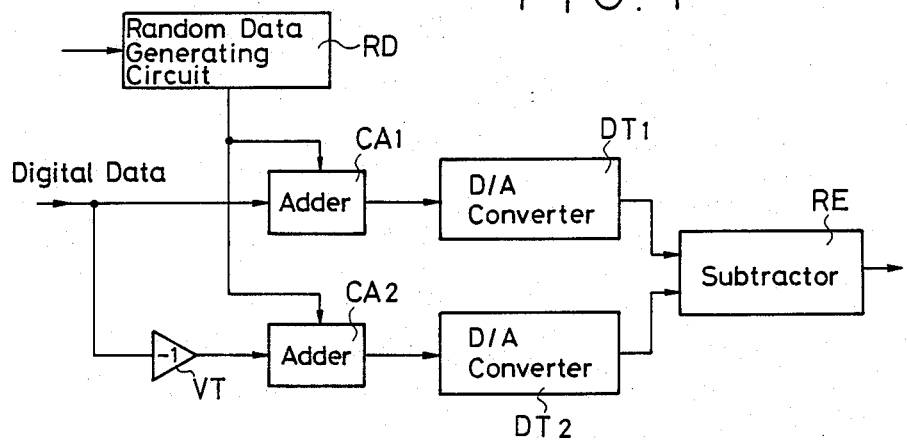
Figure 5:
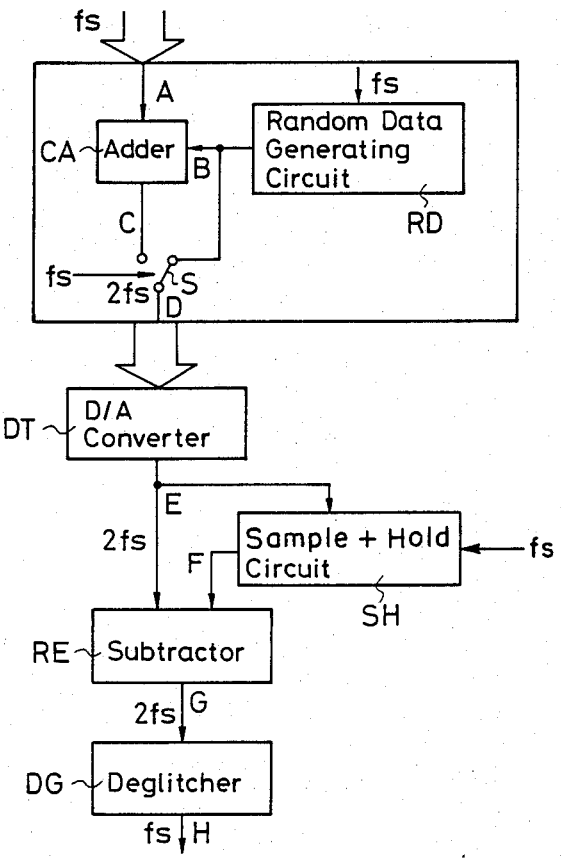

FIG. 1 is a block diagram showing an embodiment of the present invention;

FIGS. 2 and 3 are diagrams for showing the operation of the circuit shown in FIG. 1;

FIG. 4 is a block diagram showing another embodiment of the present invention;

FIG. 5 is a block diagram showing a prior art circuit arrangement; and

Figure 6:
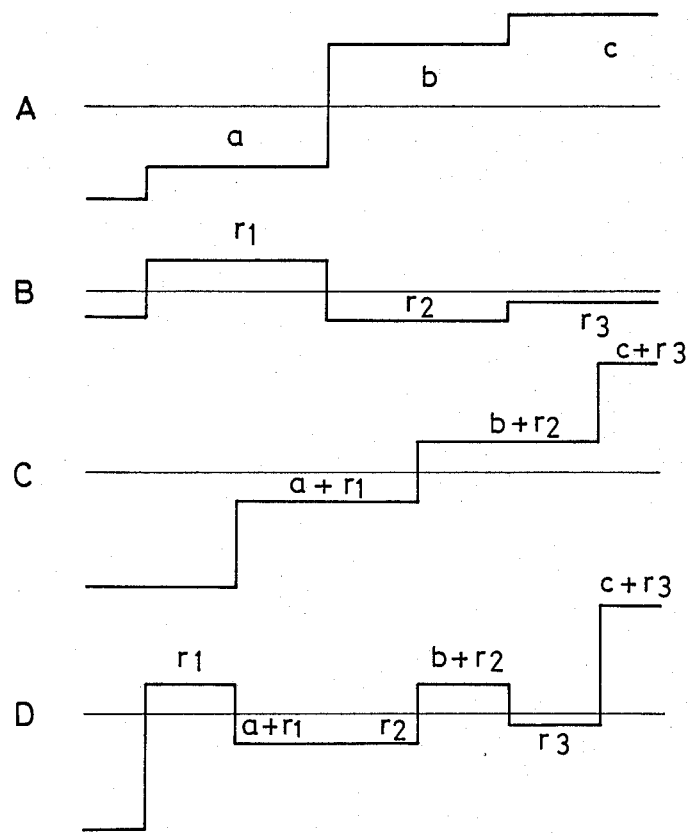

FIGS. 6 and 7 are diagrams for showing the operation of the circuit shown in FIG. 5.

DESCRIPTION OF THE PREFERRED EMBODIMENTS

In FIG. 1, VT denotes a sign inverting circuit which inverts the sign of digital data d (shown at a,b, and c in FIG. 2A) obtained by sampling at a frequency $f_s$. FIG. 2B shows the sign-reversed data d̄. The data d and d̄ are alternately selected by a selector S under the control of a clock pulse train of a frequency $f_s$, as shown in FIG. 2C, and supplied to an adder CA. The adder CA is connected to receive random data r1, r2 . . . of the frequency $f_s$, as shown in FIG. 2D, from a random data generating circuit RD, and the adder adds this random data to the output from the selector S. Specifically, identical random data r1 is added to the data a and -a shown in FIGS. 2A and 2B, respectively, and identical random data r2 is added to the data b and -b, whereby an output is generated as shown in FIG. 2E.

The output 2E from the adder CA is converted to an analog signal by a D/A converter DT, as shown in FIG. 3F. Those analog signal portions of this output analog signal, which correspond to the data d having the random data added thereto as shown in FIG. 2A, are sampled and held by a sample and hold circuit SH. Specifically, as shown in FIG. 3G, analog signal portions (a+r1), (b+r2) . . . are sampled and held and then supplied to a subtractor RE. On the other hand, the subtractor RE is further connected to receive the output from the D/A converter DT, and generates an output which corresponds to the difference between the inputs. That is, the subtractor RE generates analog signals as shown at 2a, 2b . . . in FIG. 3H, which have an amplitude corresponding to double the analog signal obtained from the digital data d and is received by a deglitcher DG which generates an output as shown in FIG. 2I.

As described above, the output analog signal has an amplitude which is twice as large as that provided by the prior art circuit arrangement. On the other hand, the resistance thermal noise contained in this analog signal will not differ from that contained in the output provided by the prior art circuit arrangement, so that an improvement of 6 decibels in signal-to-noise ratio, as compared to the prior art circuit arrangement, can be achieved by the present invention.

The deglitcher used in the above-described embodiment may be replaced by a sample and hold circuit.

Further, the selector S may select the digital data and the sign-reversed data in the reversed sequence in relation to the above-described circuit arrangement. In such a case, however, the polarization of the output from the subtractor is reversed in relation to the above-described circuit arrangement.

Further, the above-described embodiment includes a single D/A converter, and the digital data and the sign-reversed data are both converted to an analog form by means of the single D/A converter. However, two such D/A converters may also be used, as shown in FIG. 4. In the embodiment shown in FIG. 4, the random data is added to the digital data and to the sign-reversed data frm a sign-reversing circuit VT by adders CA1 and CA2, respectively. The outputs from the adders CA1 and CA2 are converted into respective analog forms by D/A converters DT1 and DT2, respectively, and a subtractor RE generates an output corresponding to the difference between them. Such a circuit arrangement will provide an output similar to that provided by the above-described embodiment.

As will be appreciated from the above description, identical random data is added both to the digital data and to the sign-reversed data, according to the present invention. These signals having the random data added thereto are converted to corresponding analog signals and the difference is taken between these analog signals, so that the output analog signal has an amplitude which is twice (four times in terms of electric power) as large as that obtained by the prior art circuit arrangement and therefore the resistance thermal noise contained in the analog signal is relatively reduced in magnitude, resulting in an improvement in the signal-to-noise ratio and therefore in an improvement in the tone quality.

What is claimed is:

1. A digital-to-analog converter device comprising:
a reversing circuit receptive of digital data with a constant period for reversing the sign of the digital datal
random data generating circuit means for generating random data synchronous with said digital data;
adding circuit means for adding the random data to both said digital data and to the reversed sign digital data corresponding to said digital data to produce an output corresponding to each;
digital-to-analog converting circuit means for converting the output from said adding circuit means into an analog signal; and
subtracting circuit means for taking the difference between the analog signal corresponding to the random data added to said digital data and the analog signal corresponding to the random data added to said reversed sign data thereby to generate a resultant analog signal the amplitude of which is substantially twice the amplitude of the analog signal corresponding to the random data added to said digital data.

2. A digital-to-analog converting method comprising:
providing digital data at a constant period;
reversing the sign of the digital data;
generating a random data synchronous with said digital data;
adding the random data to both said digital data and to the reversed sign digital data corresponding to said digital data;
converting the added digital data into an analog signal;
taking the difference between the analog signal corresponding to the random data added to said digital data and the analog signal corresponding to the random data added to said reversed sign data; and
generating an analog signal in response to said difference having an amplitude which is substantially twice the amplitude of the analog signal corresponding to the random data added to said data.

3. A digital-to-analog converter comprising:
means receptive of input digital data for producing reversed sign digital data corresponding thereto;
means for generating random digital data;
means for adding the random digital data to both the input digital data and its corresponding reversed sign digital data;
means for converting the added input and random digital data and the added reversed sign and random digital data to analog signals; and
means for subtracting the analog signal corresponding to the added reversed sign and random digital data from the analog signal corresponding to the added input and random digital data to obtain an analog signal corresponding to the input digital data, the amplitude of which is substantially twice the amplitude of the analog signal corresponding to the added input and random digital data.

4. The digital-to-analog converter according to claim 3, wherein the means for adding comprises two adders, wherein both adders are simultaneously receptive of the random digital data and one adder is receptive of the input digital data and the other adder is receptive of the reversed sign digital data corresponding thereto.

5. The digital-to-analog converter according to claim 4, wherein the converting means comprises two digital-to-analog converters, each receptive of an output from one of the adders.

6. A digital-to-analog converting method comprising:
receiving input digital data and producing reversed sign digital data corresponding thereto;
generating random digital data;
adding the random digital data to both the input digital data and its corresponding reversed sign digital data;
converting the added input and random digital data and the added reversed sign and random digital data to analog signals; and
subtracting the analog signal corresponding to the added reversed sign and random digital data from the analog signal corresponding to the added input and random digital data to obtain an analog signal corresponding to the input digital data having an amplitude which is substantially twice the amplitude of the analog signal corresponding to the added input and random digital data.

7. The digital-to-analog converter according to claim 6, wherein the step of adding comprises simultaneously receiving the random digital data and the input digital data at one adder and the reversed sign digital data and random digital data at another adder.

8. The digital-to-analog converter according to claim 7, wherein the step of converting comprises using two digital-to-analog converters, each receptive of an output from one of the adders.

9. In a system for converting a digital input signal into an analog signal by which a digital dither signal is first added to the input signal and then removed after the signals are converted to analog form, the improvement comprising:
  means for generating a sign-reversed signal of the input signal;
  means for time division selection of said input and signreversed signals;
  means for adding the digital dither signal to each of said input and sign-reversed signals to generate respective input/dither and sign-reversed input/dither signals; and
  means operative after conversion of said signals to analog form for subtracting one of said analog input/dither and sign-reversed input/dither signals from the other to generate a representative analog input signal having an amplitude substantially twice that of said analog input/dither signal.

10. The system of claim 9 in which said time division selection means comprises means for alternately selecting said signals in a predetermined sequence.

11. The system of claim 10 in which said predetermined sequence begins with selection of said input signal.

12. The system of claim 10 in which said predetermined sequence begins with selection of said sign-reversed signal.

13. The system of claim 10 comprising in addition means for removing said dither signal from said representative analog input signal.

14. The system of claim 13 in which said means for removing said dither signal comprises a sample and hold circuit.

* * * * *